US008610513B2

(12) United States Patent
Yamamoto (10) Patent No.: US 8,610,513 B2
(45) Date of Patent: Dec. 17, 2013

(54) CRYSTAL OSCILLATOR

(75) Inventor: Ken Yamamoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 66 days.

(21) Appl. No.: 13/342,985

(22) Filed: Jan. 4, 2012

(65) Prior Publication Data
US 2012/0176203 A1    Jul. 12, 2012

(30) Foreign Application Priority Data

Jan. 11, 2011 (JP) .................................. 2011-003072
Oct. 31, 2011 (JP) .................................. 2011-238325

(51) Int. Cl.
*H03B 5/36* (2006.01)

(52) U.S. Cl.
USPC ................. 331/158; 331/116 R; 331/116 FE; 331/177 V; 331/175; 331/176; 331/185

(58) Field of Classification Search
USPC ................. 331/175, 176, 116 FE, 158, 116 R, 331/177 V, 185
See application file for complete search history.

(56) References Cited

U.S. PATENT DOCUMENTS

| 8,058,941 B2 * | 11/2011 | Kurogo et al. ................ 331/158 |
| 8,217,690 B2 * | 7/2012 | Hu et al. ....................... 327/156 |
| 2007/0085620 A1 * | 4/2007 | Ohkubo et al. ........... 331/177 V |

FOREIGN PATENT DOCUMENTS

| JP | 02-100502 | 4/1990 |
| JP | 10-224148 | 8/1998 |
| JP | 11-186843 | 7/1999 |

* cited by examiner

*Primary Examiner* — Arnold Kinkead
(74) *Attorney, Agent, or Firm* — Jianq Chyun IP Office (57) ABSTRACT

A crystal oscillator is provided, which varies a frequency drift compensation according to a power consumption and compensates a frequency drift characteristic caused by heat. An adder is used to add a temperature compensation control voltage from a temperature compensation circuit, an oscillating frequency control voltage from an AFC circuit, and a frequency drift compensation voltage corresponding to the power consumption from a frequency drift compensation circuit. A voltage added by the adder is outputted to voltage-variable capacitor elements and, which respectively are connected to an input side and an output side of an inverter IC that is connected in parallel to a crystal oscillating unit.

14 Claims, 6 Drawing Sheets

CRYSTAL OSCILLATOR

CROSS-REFERENCE TO RELATED APPLICATIONS

This application claims the priority benefit of Japan application serial no. 2011-003072, filed on Jan. 11, 2011, and Japan application no. 2011-238325, filed on Oct. 31, 2011. The entirety of each of the above-mentioned patent applications is hereby incorporated by reference herein and made a part of this specification.

BACKGROUND OF THE INVENTION

1. Field of the Invention

The invention relates to a crystal oscillator, which performs temperature compensation, or a crystal oscillator, which does not perform temperature compensation, and particularly relates to a crystal oscillator capable of compensating a frequency drift characteristic that varies due to heat.

2. Description of the Related Art

[Conventional Technology]

The conventional temperature compensated crystal oscillator has a temperature compensation circuit in a voltage-controlled oscillator thereof to reduce frequency variation caused by the change of the surrounding temperature. Moreover, crystal oscillators without temperature compensation circuits have also been provided. The frequency of the conventional crystal oscillator may drift (vary or stray). In particular, the frequency drift characteristic thereof may change due to the heat caused by power source variation.

[Frequency Drift Characteristic: FIG. 10]

Figure 6:
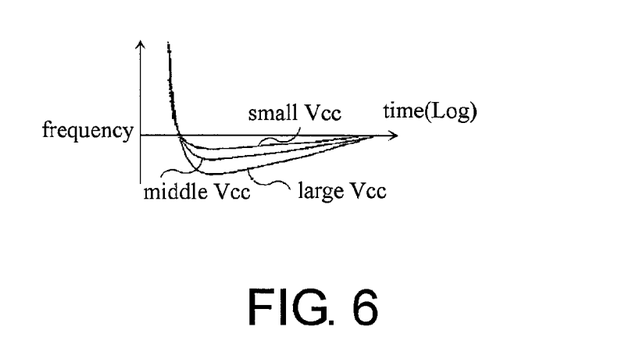
FIG. 6 is a diagram illustrating a conventional frequency drift characteristic.
Figure 10:
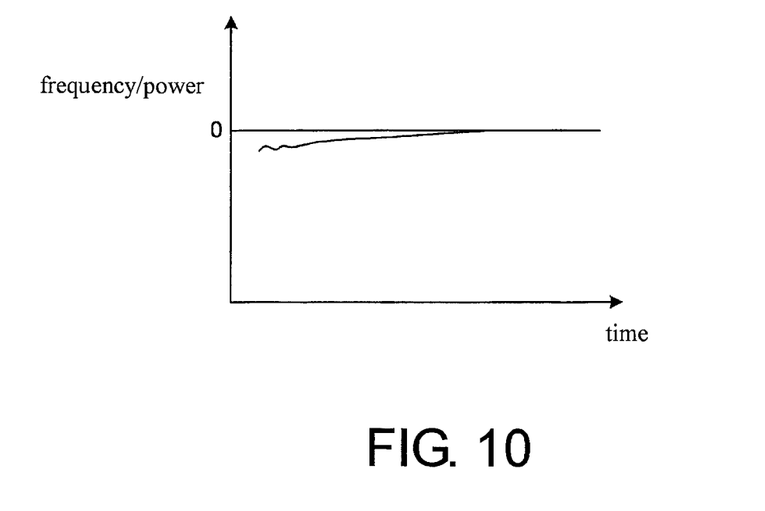
FIG. 10 is a diagram illustrating a frequency drift characteristic (electric coefficient).

A frequency drift characteristic is shown in FIG. 6 and FIG. 10. FIG. 6 is a diagram illustrating the variation of a frequency relative to time, and FIG. 10 is a diagram illustrating frequency/power relative to time, which both show the frequency drift characteristic (power coefficient). As shown in FIG. 6, it is known that, as the power source voltage becomes larger, power consumption increases, heat generation increases, and downward drifting is also large (i.e. deterioration of the frequency drift characteristic). In addition, it should be noted that, under various power conditions (that is, under various heat generations), as shown in FIG. 10, the same structures have the same frequency drift characteristic electric coefficient, and the frequency drift characteristic has a proportional relationship with power consumption.

[Related Art]

JP 10-224148 "Piezoelectric Oscillator" (TOYO Communication Equipment Co., Ltd.; referred to as "Patent Reference 1"); JP 02-100502 "Voltage Controlled Oscillator" (Murata Manufacturing Co., Ltd.; referred to as "Patent Reference 2"); and JP 11-186843 "Stabilized Oscillation Circuit" (Toshiba Microelectronics Corp.; referred to as "Patent Reference 3") are provided as conventional arts related to this field.

Patent Reference 1 discloses a voltage-controlled piezoelectric oscillator, including an amplifier formed by transistors, resistors and capacitors, a piezoelectric oscillating unit, a capacitance-variable diode, and a control voltage section formed by the resistors and the capacitors. In the voltage-controlled piezoelectric oscillator, the frequency starting characteristic of the piezoelectric oscillating circuit is shortened by varying a voltage of the anode end of the capacitance-variable diode with time. Patent Reference 2 discloses a voltage controlled oscillator, wherein a voltage-controlled oscillating circuit and a buffer circuit are serially connected, viewing from a power source. In the voltage controlled oscillator, constant voltage diodes are connected in parallel to the power source system of the oscillating circuit, and the oscillating frequency is stabilized regardless of the variation of the power source voltage.

Patent Reference 3 discloses a stabilized oscillation circuit, having frequency fluctuation suppression circuit 13a. In the frequency fluctuation suppression circuit 13a, by controlling a current of a differential amplifier type buffer output circuit 12 according to a power source voltage of a differential amplifier type oscillation circuit 11, a capacitance between the ground and the collector of the transistor of a differential amplifier pair in the differential amplifier type buffer output circuit is controlled, and the fluctuation of an oscillation frequency depending on the fluctuation of the power source voltage is suppressed.

[Patent Reference 1] JP 10-224148
[Patent Reference 2] JP 02-100502
[Patent Reference 3] JP 11-186843

However, the conventional methods for compensating the frequency drift characteristic of the crystal oscillator have the problem that the frequency drift characteristic, which varies due to heat, cannot be properly compensated because the compensation amount is fixed.

In addition, FIG. 6, which will be further described hereinafter, is a diagram illustrating the frequency drift characteristic of a conventional temperature compensated crystal oscillator and shows that the variation of the frequency drift characteristic becomes larger as the power source voltage increases.

That is, as shown in FIG. 6 and FIG. 10, the frequency drift characteristic relates to the power consumption of the oscillator and also varies due to the power consumption. Accordingly, the frequency drift characteristic deteriorates as heat increases due to the variation of the power source voltage. In comparison with setting the power source voltage low, the frequency drift characteristic becomes worse when the power source voltage is set high. The conventional crystal oscillator cannot suppress such a problem.

In addition, considering the issue that power consumption changes due to the variation of the power source voltage and the frequency drift characteristic varies due to heat, the disclosures of Patent References 1 ~3 do not compensate the frequency drift characteristic and stabilize the starting of the oscillator early.

SUMMARY OF THE INVENTION

In view of the above, the invention provides a crystal oscillator, in which a frequency drift compensation is provided variable according to the power consumption and compensates a frequency drift characteristic due to heat.

In order to solve the above-mentioned conventional problems, the invention provides a crystal oscillator that includes a crystal oscillating unit, an amplifier connected in parallel to the crystal oscillating unit, and a voltage-variable capacitor element connected to the amplifier. The crystal oscillator further includes a temperature compensation circuit, outputting a temperature control voltage to perform temperature compensation; a frequency control circuit, controlling a frequency by an input signal; and a frequency drift compensation circuit, outputting a frequency drift compensation control voltage for compensating a frequency drift characteristic according to power consumption. An output from the temperature compensation circuit, an output from the frequency control circuit, and an output from the frequency drift compensation circuit are added and outputted to the voltage-variable capacitor element. The invention makes a frequency drift compensation variable according to the power consumption and has an effect of compensating the frequency drift characteristic caused by heat.

According to an embodiment of the invention, the crystal oscillator further includes a constant voltage circuit that approximately maintains a current consumption of the crystal oscillator constant relative to a variation of a power source voltage of the crystal oscillator constant. The frequency drift compensation circuit outputs a control voltage for compensating the frequency drift characteristic according to the power source voltage of the crystal oscillator.

[Current Consumption: FIG. 11]

Figure 11:
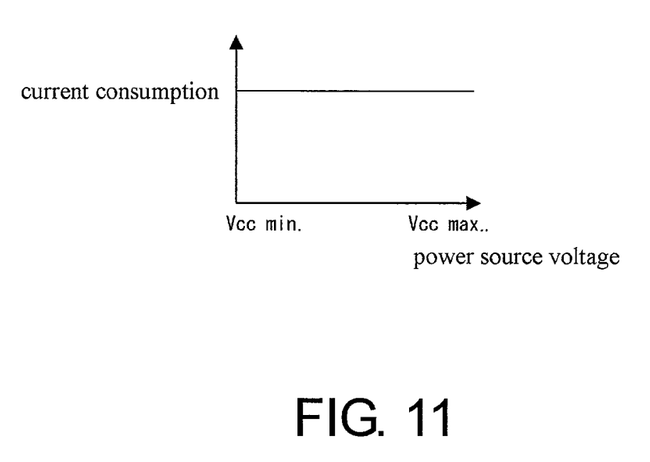
FIG. 11 is a diagram illustrating a relation between an oscillator power source voltage and oscillator current consumption.

FIG. 11 is a diagram illustrating a relation between the power source voltage of the crystal oscillator and a current consumption of the crystal oscillator. As shown in FIG. 11, in a crystal oscillator that includes the constant voltage circuit, the current consumption of the crystal oscillator is approximately maintained constant relative to the variation of the power source voltage of the crystal oscillator. Because the current consumption of the crystal oscillator is approximately maintained constant, the power consumption is approximately proportional to the power source voltage.

According to an embodiment of the invention, the crystal oscillator can be configured without the temperature compensation circuit for outputting the temperature control voltage to perform temperature compensation, or without the frequency control circuit for controlling the frequency by the input signal, or without the adder and directly outputting the output from the temperature compensation circuit, the output from the frequency control circuit, and the output from the frequency drift compensation circuit to the voltage-variable capacitor element.

In the crystal oscillator according to an embodiment of the invention, a first frequency drift compensation circuit includes a constant current source circuit; a condenser having one end connected to the constant current source circuit and the other end grounded; a diode, having an anode connected to the constant current source circuit and a cathode grounded and restricting a voltage across the two ends of the condenser; and an amplifier for amplifying a signal drawn from a wire connecting the constant current source circuit and the condenser and outputting the frequency drift compensation control voltage for compensating the frequency drift characteristic.

In the crystal oscillator according to another embodiment of the invention, a second frequency drift compensation circuit includes a first P-channel field effect transistor; a second P-channel field effect transistor; and an amplifier outputting the frequency drift compensation control voltage for compensating the frequency drift characteristic. A drain and a gate of the first P-channel field effect transistor and a gate of the second P-channel field effect transistor are grounded via a resistor. A source of the first P-channel field effect transistor and a source of the second P-channel field effect transistor are applied with a source voltage. A drain of the second P-channel field effect transistor is grounded via a condenser and connected to an input of the amplifier. Further, a diode is disposed in a manner that an anode is connected to the drain of the second P-channel field effect transistor and a cathode is grounded, so as to restrict a voltage across the two ends of the condenser.

The aforementioned frequency drift compensation circuit can adjust a compensation characteristic for the frequency drift characteristic by adjusting a current value flowing through the second P-channel field effect transistor. Further, the adjustment of the current value can be achieved by adjusting a resistance of the resistor connected to the drain and the gate of the P-channel first field effect transistor, or by adjusting size ratios of the first P-channel field effect transistor and the second P-channel field effect transistor. In addition, the aforementioned frequency drift compensation circuit is formed by the P-channel field effect transistors. However, a frequency drift compensation circuit formed by N-channel field effect transistors can also provide the same effect.

According to the crystal oscillator of an embodiment of the invention, the first or the second frequency drift compensation circuit compensates the frequency drift characteristic by adjusting a gain of the amplifier thereof according to the power source voltage of the crystal oscillator.

According to the crystal oscillator of an embodiment of the invention, source voltage of the second frequency drift compensation circuit is connected to the power source voltage of the crystal oscillator. A signal generated according to the power source voltage of the crystal oscillator is outputted to the amplifier, and the frequency drift characteristic is compensated.

DESCRIPTION OF REFERENCE NUMERALS 1. temperature compensation circuit; 2. AFC (Auto Frequency Control) circuit; 3. frequency drift compensation circuit; 4. adder; 5. crystal oscillating unit; 6. inverter IC (integrated circuit); 7a, 7b, 7c, 7d. voltage-variable capacitor element; 8. buff; 9. output terminal; 10. constant voltage circuit; 11. adder; 12. amplifier; 30. diode; 31. constant current source circuit; 32. condenser; 33. amplifier (AMP); 34. power source; 35. resistor; 36. field effect transistor (FET); 37. field effect transistor (FET); 38. condenser; 39. amplifier (AMP); R1~R4. high frequency cut-off resistor

DESCRIPTION OF THE PREFERRED EMBODIMENT

Exemplary embodiments of the invention are described below with reference to the accompanying drawings.

[Summary of the Embodiments]

According to an embodiment of the invention, a crystal oscillator includes a crystal oscillating unit, an amplifier connected in parallel with the crystal oscillating unit, and a voltage-variable capacitor element connected with the amplifier. In addition, the crystal oscillator further includes a temperature compensation circuit outputting a control voltage to perform temperature compensation; a frequency control circuit controlling a frequency by an input signal; and a frequency drift compensation circuit outputting a control voltage to compensate a frequency drift characteristic according to a power consumption. An output from the temperature compensation circuit, an output from the frequency control circuit, and an output from the frequency drift compensation circuit are added and then outputted to a voltage-variable capacitor element. A frequency drift compensation is made to vary according to the power consumption, and the frequency drift characteristic caused by heat is thereby compensated.

According to an embodiment of the invention, a crystal oscillator includes a crystal oscillating unit; an amplifier connected in parallel with the crystal oscillating unit; a voltage-variable capacitor element connected with the amplifier; a constant voltage circuit, approximately maintaining a current consumption of the crystal oscillator constant relative to a variation of a power source voltage of the oscillator; a temperature compensation circuit outputting a control voltage to perform a temperature compensation; a frequency control circuit controlling a frequency by an input signal; and a frequency drift compensation circuit outputting a control voltage to compensate a frequency drift characteristic according to the power source voltage of the oscillator. An output from the temperature compensation circuit, an output from the frequency control circuit, and an output from the frequency drift compensation circuit are added and then outputted to a voltage-variable capacitor element. A frequency drift compensation is made to vary according to the oscillator power source voltage, and the frequency drift characteristic caused by heat is thereby compensated.

Moreover, according to an embodiment of the invention, a crystal oscillator is configured without the temperature compensation circuit outputting the control voltage that performs temperature compensation, or without the frequency control circuit controlling the frequency by the input signal in the aforementioned structure, or with no adder and directly outputting the output from the temperature compensation circuit, the output from the frequency control circuit, and the output from the frequency drift compensation circuit to the voltage-variable capacitor element.

Figure 1:
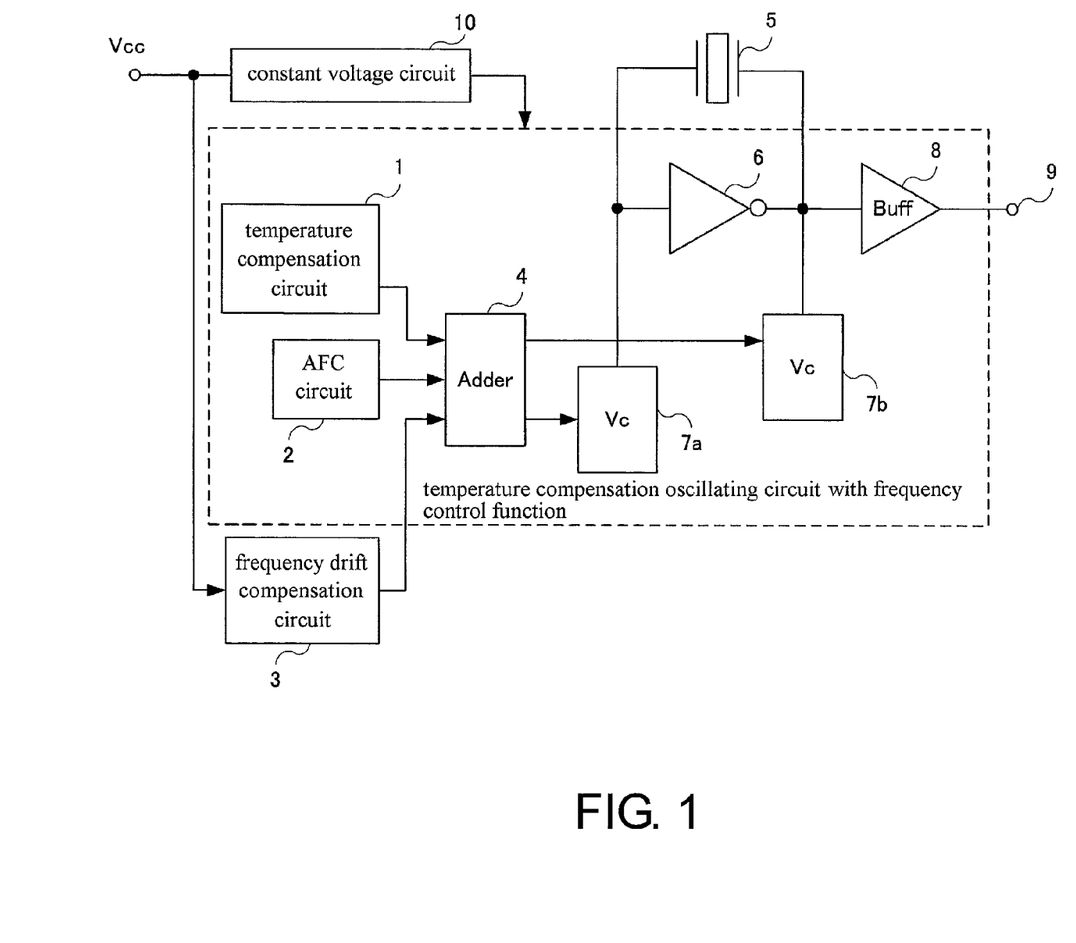
FIG. 1 is a block diagram illustrating a structure of the first crystal oscillator according to an embodiment of the invention.

[First Crystal Oscillator: FIG. 1]

A first crystal oscillator according to an embodiment of the invention is described below with reference to FIG. 1. FIG. 1 is a block diagram illustrating a structure of the first crystal oscillator according to an embodiment of the invention. As shown in FIG. 1, the first crystal oscillator (referred to as "first oscillator" hereinafter) in an embodiment of the invention basically includes a temperature compensation circuit 1, an AFC (Auto Frequency Control) circuit 2, a frequency drift compensation circuit 3, an adder 4, a crystal oscillating unit 5, an inverter IC (Integrated Circuit) 6, voltage-variable capacitor elements (Vc) 7a & 7b, a buff 8, an output terminal 9, and a constant voltage circuit 10. Additionally, a section surrounded by a dashed line in FIG. 1 indicates a temperature compensation oscillating circuit having a frequency control function.

[Parts of First Oscillator]

The following paragraphs specifically describe each part of the oscillator. The temperature compensation circuit 1 detects a temperature around the crystal oscillating unit 5 and outputs a control voltage (temperature compensation control voltage) for temperature compensation to the adder 4 according to the detected temperature. The AFC circuit 2 outputs a control voltage (oscillating frequency control voltage) to the adder 4, in which the control voltage is used for enabling an oscillation at a specific frequency from the output terminal 9.

The frequency drift compensation circuit 3 is a featured structure in this embodiment and outputs a control voltage (frequency drift compensation control voltage) to the adder 4, in which the control voltage is used for compensating a frequency drift characteristic of the oscillator according to a power consumption. The specific structure and compensation operation of the frequency drift compensation circuit 3 will be explained hereinafter.

The adder 4 adds the temperature compensation control voltage from the temperature compensation circuit 4, the oscillating frequency control voltage from the AFC circuit 2, and the frequency drift compensation control voltage from the frequency drift compensation circuit 3 and outputs an added result to the voltage-variable capacitor elements 7a and 7b. In addition, the addition performed by the adder 4 is also achievable by weighting each input voltage.

The crystal oscillating unit 5 includes a crystal plate and electrodes that clamp the crystal plate. The crystal oscillating unit 5 oscillates by a resonance frequency between the crystal oscillating unit 5 and a load capacitor viewed from two ends of the crystal oscillating unit 5. The inverter IC 6 amplifies the frequency oscillated by the crystal oscillating unit 5, inverts a phase thereof, and outputs the same to the buff 8.

The voltage-variable capacitor elements (Vc) 7a and 7b are formed by variable-capacitive diodes for example, and their capacitances are varied according to a voltage applied thereto so as to adjust the oscillating frequency. Specifically, the voltage-variable capacitor element 7a is applied with the output voltage from the adder 4, generates a capacitance according to the output voltage, varies the load capacitance of the crystal oscillating unit, and adjusts the oscillating frequency. Moreover, the voltage-variable capacitor element 7b is applied with the output voltage from the adder 4, generates a capacitance according to the output voltage, varies the load capacitance of the crystal oscillating unit, and adjusts the oscillating frequency.

The buff 8 is a signal amplifier, and amplifies an oscillating signal from the inverter IC 6 and outputs the amplified oscillating signal at the output terminal 9. The output terminal 9 is a terminal, which outputs the oscillating signal of the oscillator. The constant voltage circuit 10 is supplied with a power source voltage Vcc of the oscillator, approximately maintains a current consumption of the crystal oscillator constant relative to a variation of the power source voltage of the crystal oscillator, and supplies a constant voltage to each necessary part in the temperature compensation oscillating circuit that has a frequency control function.

Figure 2:
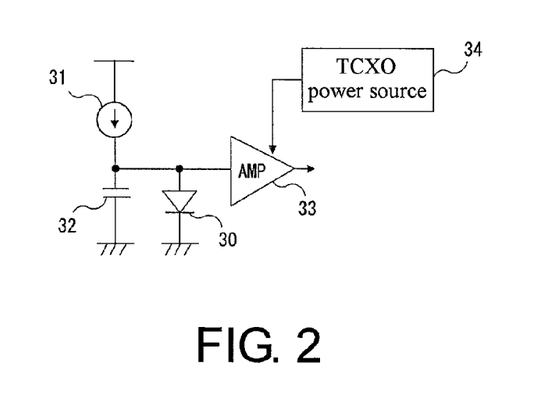
FIG. 2 is a circuit diagram of a frequency drift compensation circuit.

[Frequency Drift Compensation Circuit: FIG. 2]

Next, the frequency drift compensation circuit 3 is described below with reference to FIG. 2. FIG. 2 is a circuit diagram of the frequency drift compensation circuit. As shown in FIG. 2, the frequency drift compensation circuit 3 includes a constant current source circuit 31, a condenser 32, an amplifier (AMP) 33, and a diode 30.

The constant current source circuit 31 is to generate a constant current according to a voltage applied thereon, and outputs the constant current to one end of the condenser 32. The condenser 32 inputs the constant current from the constant current source circuit 31 to one end of the condenser 32, and the other end is grounded. The diode 30 is used to restrict a voltage across the two ends of the condenser 32. An anode of the diode 30 is connected between the constant current source circuit 31 and the condenser 32, and a cathode, i.e., the other end of the diode 30, is grounded.

The amplifier (AMP) 33 has an input end connected to one end of the condenser 32, performs amplification with a gain according to the oscillator power source voltage Vcc supplied from the oscillator power source 34 of the first oscillator (TCXO: Temperature Compensated Crystal Oscillator), and outputs an amplified result to the adder 4.

Figure 3:
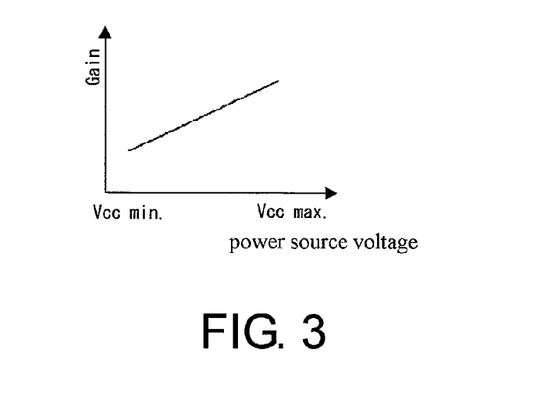
FIG. 3 is a diagram showing a gain characteristic of an amplifier (AMP).

[Gain Characteristic of Amplifier: FIG. 3]

A gain characteristic of the amplifier 33 is explained with reference to FIG. 3. FIG. 3 is a diagram showing the gain characteristic of the amplifier (AMP). According to the gain characteristic of the amplifier 33 shown in FIG. 3, the gain increases as the power source voltage increases.

Figure 4:
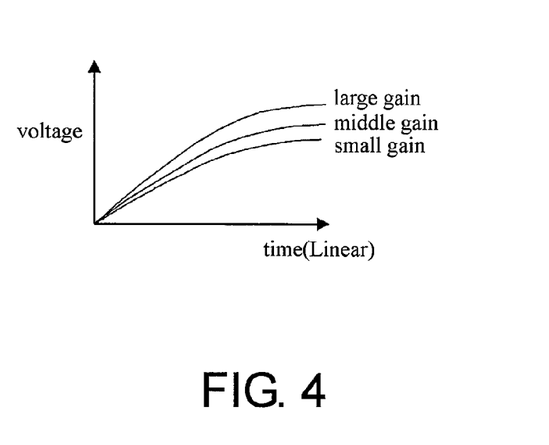
FIG. 4 is a diagram illustrating an output voltage characteristic of a frequency drift compensation circuit.

[Output Voltage Characteristic of Frequency Drift Compensation Circuit: FIG. 4]

Further, an output voltage characteristic of the frequency drift compensation circuit 3 is explained with reference to FIG. 4. FIG. 4 is a diagram illustrating the output voltage characteristic of the frequency drift compensation circuit 3. In FIG. 4, the output voltages with respect to time are shown in the conditions of large, intermediate, and small gains. The higher the voltage from the TCXO power source 34 is, the larger the gain of the amplifier 33 becomes. In addition, the output voltage from the frequency drift compensation circuit 3 becomes higher as the gain of the amplifier 33 increases and becomes lower as the gain decreases.

Figure 5:
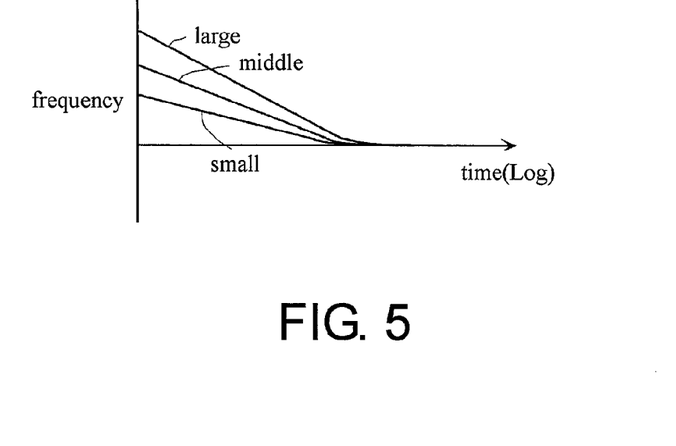
FIG. 5 is a diagram showing a correction frequency characteristic of a frequency drift compensation circuit.

[Correction Frequency Characteristic of Frequency Drift Compensation Circuit: FIG. 5]

A correction frequency of the frequency drift compensation circuit 3 is shown in FIG. 5. FIG. 5 is a diagram showing a correction frequency characteristic of the frequency drift compensation circuit. In FIG. 5, frequencies with respect to time in conditions of large, intermediate, and small gains are depicted. As shown in FIG. 5, the correction frequency characteristic of the frequency drift compensation circuit shows that a variation of the frequency becomes small as the gain of the amplifier 33 decreases, and the variation becomes large as the gain increases.

[Frequency Drift Characteristic: FIG. 6]

A frequency drift characteristic is shown in FIG. 6. FIG. 6 is a diagram illustrating a conventional frequency drift characteristic. As explained in the prior art, the frequency drift characteristic in FIG. 6 is that, as the power source voltage of the oscillator becomes larger, the power consumption increases and heat increases, and consequently the drifting amount also becomes larger (that is, the frequency drift characteristic is deteriorating). Moreover, as the power source voltage of the oscillator becomes smaller, the power consumption decreases and heat decreases, and consequently the drifting amount also becomes smaller.

Figure 7:
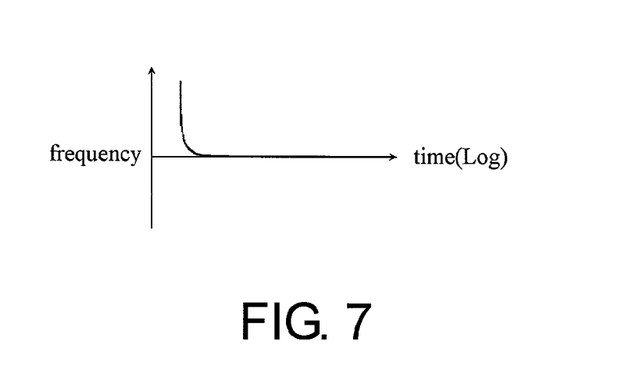
FIG. 7 is a diagram depicting a frequency drift post-compensation characteristic.

[Frequency Drift Post-Compensation Characteristic: FIG. 7]

Next, a characteristic after frequency drift compensation is illustrated in FIG. 7. FIG. 7 is a diagram depicting a characteristic after the frequency drift compensation. If the frequency drift characteristic of FIG. 6 is corrected by the correction frequency characteristic of the frequency drift compensation circuit shown in FIG. 5, a compensated characteristic shown in FIG. 7 is be obtained. In other words, FIG. 7 shows a characteristic of a combination of FIGS. 5 and 6. Referring to FIG. 7, the frequency drift compensation circuit 3 performs a compensation for the frequency drift characteristic according to the magnitude of the power source voltage (power consumption), and therefore the characteristic after the frequency drift compensation is stabilized early and maintained constant regardless of the magnitude of the power source voltage of the crystal oscillator. Moreover, the time on the transverse axis of FIGS. 5~7 is represented by Log.

Figure 8:
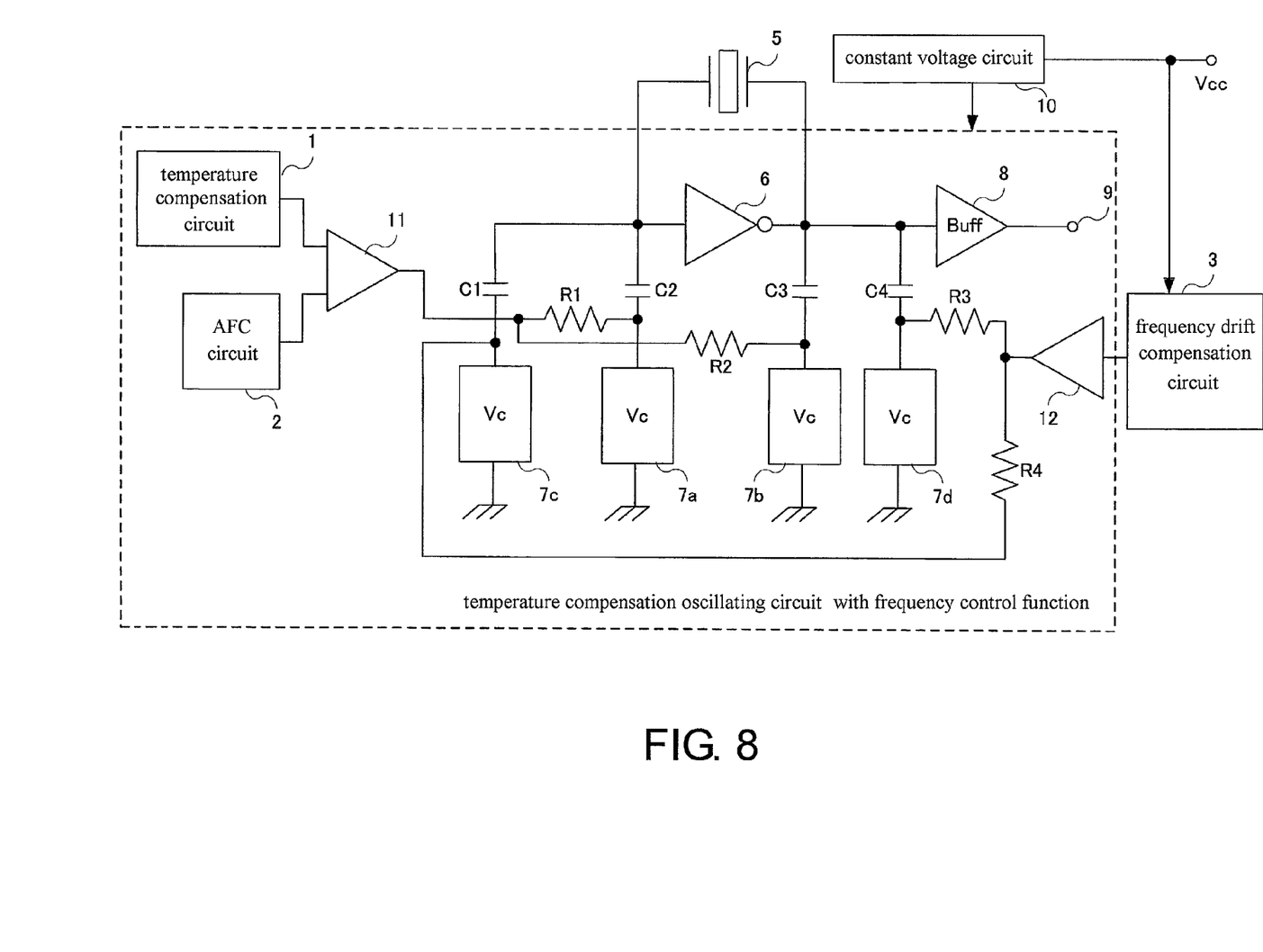
FIG. 8 is a block diagram illustrating a structure of the second crystal oscillator according to an embodiment of the invention.

[Second Crystal Oscillator: FIG. 8]

Next, a second crystal oscillator in another embodiment of the invention is described with reference to FIG. 8. FIG. 8 is a block diagram illustrating a structure of the second crystal oscillator according to an embodiment of the invention. As shown in FIG. 8, the second crystal oscillator (referred to as "second oscillator" hereinafter) with respect to the embodiment of the invention basically includes a temperature compensation circuit 1, an AFC circuit 2, a frequency drift compensation circuit 3, a crystal oscillating unit 5, an inverter IC 6, voltage-variable capacitor elements (Vc) 7a, 7b, 7c, and 7d, a buff 8, an output terminal 9, a constant voltage circuit 10, an adder 11, and an amplifier 12. The aforesaid component of the second oscillator is basically the same as that of the first oscillator. Therefore, detailed descriptions of the components in FIG. 1 are omitted hereinafter. In addition, a section surrounded by a dashed line in FIG. 8 indicates the temperature compensation oscillating circuit having a frequency control function.

An input of the inverter IC 6 is connected to one end of a condenser C1 and one end of a condenser C2. The other end of the condenser C1 is connected to one end of the voltage-variable capacitor element 7c, and the other end of the condenser C2 is connected to one end of the voltage-variable capacitor element 7a. The other ends of the voltage-variable capacitor elements 7c and 7a are grounded. Further, an output of the inverter IC 6 is connected to a terminal of the condenser C3 and a terminal of the condenser C4. The other end of the condenser C3 is connected to one end of the voltage-variable capacitor element 7b, and the other end of the condenser C4 is connected to one end of the voltage-variable capacitor element 7d. The other ends of the voltage-variable capacitor elements 7b and 7d are grounded.

The constant voltage circuit 10 is supplied with the power source voltage Vcc of the crystal oscillator and approximately maintains the current consumption of the crystal oscillator constant relative to the variation of the power source voltage of the oscillator. Further, the constant voltage circuit 10 supplies a constant voltage to each necessary part of the temperature compensation oscillating circuit that has a frequency control function. The adder 11 adds the output voltage (temperature compensation control voltage) of the temperature compensation circuit 1 and the output voltage (oscillating frequency control voltage) of the AFC circuit 2, and applies the added result to a node between the other end of the condenser C2 and one end of the voltage-variable capacitor element 7a via a high frequency cut-off resistor R1, and to a node between the other end of the condenser C3 and one end of the voltage-variable capacitor element 7b via a high frequency cut-off resistor R2.

The amplifier 12 amplifies the output voltage (frequency drift compensation control voltage) from the frequency drift compensation circuit 3, and applies the amplified output voltage to a node between the other end of the condenser C1 and one end of the voltage-variable capacitor element 7c via a high frequency cut-off resistor R4, and to a node between the other end of the condenser C4 and one end of the voltage-variable capacitor element 7d via a high frequency cut-off resistor R3.

A capacitance of the voltage-variable capacitor element 7a is adjusted by the output voltage applied to one end of the voltage-variable capacitor element 7a from the adder 11 to vary the frequency. In addition, a capacitance of the voltage-variable capacitor element 7b is adjusted according to the output voltage applied to one end of the voltage-variable capacitor element 7b from the adder 11 to vary the frequency.

In addition, a capacitance of the voltage-variable capacitor element 7c is adjusted by the output voltage applied to one end of the voltage-variable capacitor element 7c from the amplifier 12 to vary the frequency, and a capacitance of the voltage-variable capacitor element 7d is adjusted by the output voltage applied to one end of the voltage-variable capacitor element 7d from the amplifier 12 to vary the frequency.

The second oscillator is the same as the first oscillator that the frequency drift compensation circuit 3 outputs the correction frequency characteristic according to the power consumption for compensating the frequency drift characteristic, compensates the frequency drift characteristic, and thus the starting of the oscillator is stabilized early.

Figure 9:
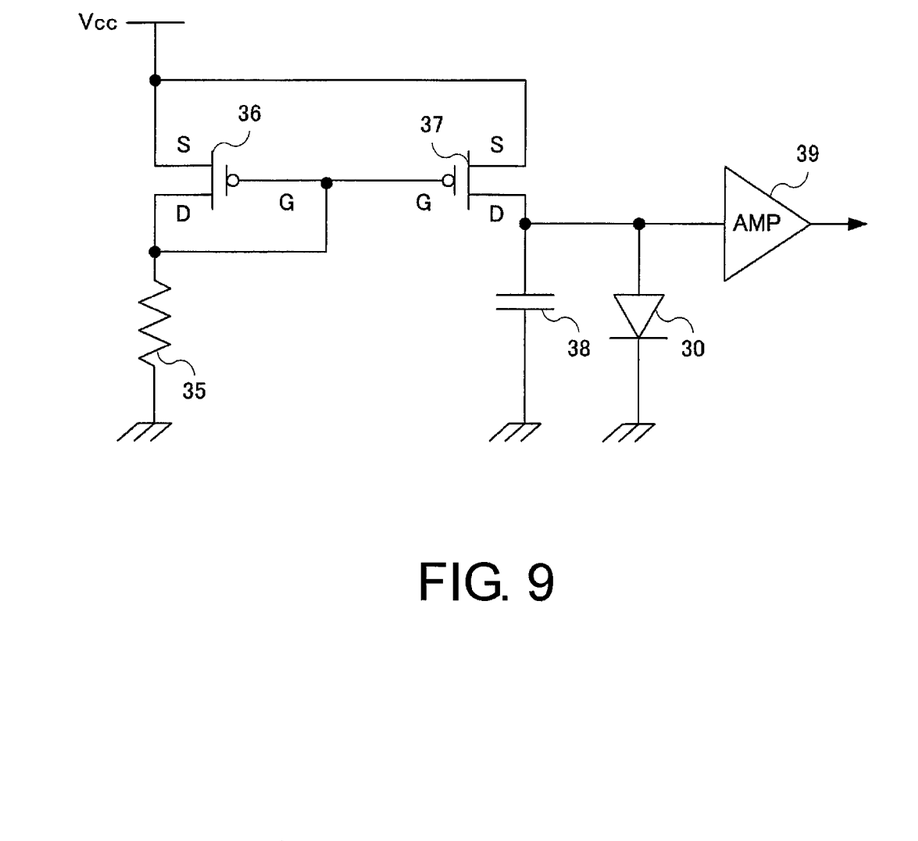
FIG. 9 is a circuit diagram of an example of a frequency drift compensation circuit.

[One Example of Frequency Drift Compensation Circuit: FIG. 9]

Next, an example of the frequency drift compensation circuit is described with reference to FIG. 9. FIG. 9 is a circuit diagram showing the example of the frequency drift compensation circuit. As shown in FIG. 9, the frequency drift compensation circuit includes a resistor 35, P-channel field effect transistors (FET) 36 and 37, a condenser 38, a diode 30, and an amplifier (AMP) 39. In addition, the frequency drift compensation circuit of FIG. 9 is applicable to the frequency drift compensation circuit 3 of FIG. 1 or FIG. 8.

A power source voltage Vcc is applied to a source of the FET 36 and a source of the FET 37. Moreover, one end of the resistor 35 is connected to a drain of the FET 36 and gates of the FET 36 and the FET 37. The gates of the FET 36 and the FET 37 are connected to each other. The other end of the resistor 35 is grounded. A drain of the FET 37 is connected to an input of the AMP 39 and one end of the condenser 38. The other end of the condenser 38 is grounded.

The diode 30 restricts a voltage across the ends of the condenser 38 and has an anode connected to the drain of the FET 37 and a cathode grounded. Herein, a value of the current flowing through the FET 37 is adjusted by adjusting a value of the resistor 35 and size ratios of the FET 36 and FET 37. Thereby, the correction characteristic for the frequency drift characteristic is adjusted.

The frequency drift compensation circuit of FIG. 9 uses the resistor 35, the FET 36, and the FET 37 to implement the constant current source circuit 31 in the frequency drift compensation circuit of FIG. 2. The input of the condenser 38 is a constant current, which reflects the variation of the power source voltage Vcc. That is, the output of the AMP 39 is the frequency drift compensation voltage according to the power consumption of the power source. Thus, adjustment of gain is necessary in the AMP 33 of FIG. 2, but adjustment of gain is not necessary in the AMP 39 of FIG. 9. However, the power source voltage may also be set to a constant voltage, and the gain of the AMP 39 may be adjusted according to the power source voltage of the oscillator. In addition, the output of the AMP 39 may also be inverted where appropriate.

[Example of Application]

In the first oscillator, the output voltage from the temperature compensation circuit 1, the output voltage from the AFC circuit 2, and the output voltage from the frequency drift compensation circuit 3 are added by the adder 4, and the added result is outputted to the voltage-variable capacitor elements 7a and 7b. However, the adder 4 may also be omitted, and each of the output voltages may be directly outputted to the voltage-variable capacitor elements 7a and 7b. Moreover, the first oscillator may have a structure that does not include the temperature compensation circuit 1 or the AFC circuit 2, or does not include both the temperature compensation circuit 1 and the AFC circuit 2. In the case that the first oscillator does not include both the temperature compensation circuit 1 and the AFC circuit 2, the adder 11 is not required.

In the second oscillator, the output voltage from the temperature compensation circuit 1 and the output voltage from the AFC circuit 2 are added by the adder 11, and the added result is outputted to the voltage-variable capacitor elements 7a and 7b. However, the adder 11 may also be omitted, and each of the output voltages is directly outputted to the voltage-variable capacitor elements 7a and 7b. Furthermore, the second oscillator may have a structure that does not include the temperature compensation circuit 1 or the AFC circuit 2, or does not include both the temperature compensation circuit 1 and the AFC circuit 2. In the condition that the second oscillator does not include the temperature compensation circuit 1 or the AFC circuit 2, or does not include both the temperature compensation circuit 1 and the AFC circuit 2, the adder 11 is not required.

[Effect of the Embodiment]

According to the first and the second oscillators, the temperature compensation control voltage from the temperature compensation circuit 1, the oscillating frequency control voltage from the AFC circuit 2, and the frequency drift compensation control voltage according to the power consumption from the frequency drift compensation circuit 3 are supplied to the voltage-variable capacitor elements 7a-7b or 7a~7d. Thus, the frequency drift characteristic is compensated by the frequency drift compensation circuit 3 according to the power consumption, and the first and the second oscillators have an effect that the starting of the oscillators can be stabilized early.

The invention is suitable for a crystal oscillator, which adjusts the frequency drift compensation according to the power consumption and compensates the frequency drift characteristic caused by heat.

What is claimed is:

1. A crystal oscillator, including a crystal oscillating unit, an amplifier connected in parallel to the crystal oscillating unit, a voltage-variable capacitor element connected to the amplifier, comprising:
    a temperature compensation circuit, outputting a temperature control voltage to perform a temperature compensation;
    a frequency control circuit, controlling a frequency according to an input signal;
    a frequency drift compensation circuit, outputting a frequency drift compensation control voltage that compensates a frequency drift characteristic according to a power consumption; and
    a constant voltage circuit, approximately maintaining a current consumption of the crystal oscillator constant relative to a variation of a power source voltage of the crystal oscillator,
    wherein an output from the temperature compensation circuit, an output from the frequency control circuit, and an output from the frequency drift compensation circuit are added and outputted to the voltage-variable capacitor element,
    wherein the frequency drift compensation circuit outputs the frequency drift compensation control voltage for compensating the frequency drift characteristic according to the power source voltage of the crystal oscillator.

2. A crystal oscillator, including a crystal oscillating unit, an amplifier connected in parallel to the crystal oscillating unit, a voltage-variable capacitor element connected to the amplifier, comprising:

a temperature compensation circuit, outputting a temperature control voltage to perform a temperature compensation;

a frequency control circuit, controlling a frequency according to an input signal; and a frequency drift compensation circuit, outputting a frequency drift compensation control voltage that compensates a frequency drift characteristic according to a power consumption, wherein an output from the temperature compensation circuit, an output from the frequency control circuit, and an output from the frequency drift compensation circuit are added and outputted to the voltage-variable capacitor element, wherein the frequency drift compensation circuit further comprises:

a constant current source circuit;

a condenser, having one end connected to the constant current source circuit and an other end grounded;

a diode, having an anode connected to the constant current source circuit and a cathode grounded, and for restricting a voltage across the one end and the other end of the condenser; and an amplifier, for amplifying a signal drawn from a wire connected to the constant current source circuit and the condenser, and outputting the frequency drift compensation control voltage that compensates the frequency drift characteristic.

3. The crystal oscillator according to claim 1, wherein the frequency drift compensation circuit further comprises:

a constant current source circuit;

a condenser, having one end connected to the constant current source circuit and an other end grounded;

a diode, having an anode connected to the constant current source circuit and a cathode grounded, and for restricting a voltage across the one end and the other end of the condenser; and an amplifier, for amplifying a signal drawn from a wire connected to the constant current source circuit and the condenser, and outputting the frequency drift compensation control voltage that compensates the frequency drift characteristic.

4. A crystal oscillator, including a crystal oscillating unit, an amplifier connected in parallel to the crystal oscillating unit, a voltage-variable capacitor element connected to the amplifier, comprising:

a temperature compensation circuit, outputting a temperature control voltage to perform a temperature compensation;

a frequency control circuit, controlling a frequency according to an input signal; and a frequency drift compensation circuit, outputting a frequency drift compensation control voltage that compensates a frequency drift characteristic according to a power consumption, wherein an output from the temperature compensation circuit, an output from the frequency control circuit, and an output from the frequency drift compensation circuit are added and outputted to the voltage-variable capacitor element, wherein the frequency drift compensation circuit further comprises:

a first P-channel field effect transistor;

a second P-channel field effect transistor; and an amplifier, for outputting the frequency drift compensation control voltage to compensate the frequency drift characteristic, wherein a drain and a gate of the first P-channel field effect transistor and a gate of the second P-channel field effect transistor are grounded via a resistor, a source of the first P-channel field effect transistor and a source of the second P-channel field effect transistor are applied with a source voltage, a drain of the second P-channel field effect transistor is grounded via a condenser and connected to an input of the amplifier, and a diode, having an anode and a cathode, for restricting a voltage across the one end and the other end of the condenser, and disposed in a manner that the anode is connected to the drain of the second P-channel field effect transistor and the cathode is grounded.

5. The crystal oscillator according to claim 1, wherein the frequency drift compensation circuit further comprises:

a first P-channel field effect transistor;

a second P-channel field effect transistor; and an amplifier, for outputting the frequency drift compensation control voltage to compensate the frequency drift characteristic, wherein a drain and a gate of the first P-channel field effect transistor and a gate of the second P-channel field effect transistor are grounded via a resistor, a source of the first P-channel field effect transistor and a source of the second P-channel field effect transistor are applied with a source voltage, a drain of the second P-channel field effect transistor is grounded via a condenser and connected to an input of the amplifier, and a diode, having an anode and a cathode, for restricting a voltage across the one end and the other end of the condenser, and disposed in a manner that the anode is connected to the drain of the second P-channel field effect transistor and the cathode is grounded.

6. The crystal oscillator according to claim 2, wherein the frequency drift compensation circuit compensates the frequency drift characteristic by adjusting a gain of the amplifier of the frequency drift compensation circuit according to the power source voltage of the crystal oscillator.

7. The crystal oscillator according to claim 3, wherein the frequency drift compensation circuit compensates the frequency drift characteristic by adjusting a gain of the amplifier of the frequency drift compensation circuit according to the power source voltage of the crystal oscillator.

8. The crystal oscillator according to claim 4, wherein the frequency drift compensation circuit compensates the frequency drift characteristic by adjusting a gain of the amplifier of the frequency drift compensation circuit according to the power source voltage of the crystal oscillator.

9. The crystal oscillator according to claim 5, wherein the frequency drift compensation circuit compensates the frequency drift characteristic by adjusting a gain of the amplifier of the frequency drift compensation circuit according to the power source voltage of the crystal oscillator.

10. The crystal oscillator according to claim 4, wherein the source voltage supplied to the frequency drift compensation circuit is connected to the power source voltage of the crystal oscillator.

11. The crystal oscillator according to claim 5, wherein the source voltage supplied to the frequency drift compensation circuit is connected to the power source voltage of the crystal oscillator.

12. A crystal oscillator, including a crystal oscillating unit, an amplifier connected in parallel to the crystal oscillating unit, a voltage-variable capacitor element connected to the amplifier, comprising:

a temperature compensation circuit, outputting a temperature control voltage to perform a temperature compensation;

a frequency drift compensation circuit, outputting a frequency drift compensation control voltage that compensates a frequency drift characteristic according to a power consumption; and a constant voltage circuit, approximately maintaining a current consumption of the crystal oscillator constant relative to a variation of a power source voltage of the crystal oscillator, wherein an output from the temperature compensation circuit and an output from the frequency drift compensation circuit are added and outputted to the voltage-variable capacitor element, wherein the frequency drift compensation circuit outputs the frequency drift compensation control voltage for compensating the frequency drift characteristic according to the power source voltage of the oscillator.

13. A crystal oscillator, including a crystal oscillating unit, an amplifier connected in parallel to the crystal oscillating unit, a voltage-variable capacitor element connected to the amplifier, comprising:

a frequency control circuit, controlling a frequency according to an input signal;

a frequency drift compensation circuit, outputting a frequency drift compensation control voltage that compensates a frequency drift characteristic according to a power consumption; and a constant voltage circuit, approximately maintaining a current consumption of the crystal oscillator constant relative to a variation of a power source voltage of the crystal oscillator, wherein an output from the frequency control circuit and an output from the frequency drift compensation circuit are added and outputted to the voltage-variable capacitor element, wherein the frequency drift compensation circuit outputs the frequency drift compensation control voltage for compensating the frequency drift characteristic according to the power source voltage of the oscillator.

14. A crystal oscillator, including a crystal oscillating unit, an amplifier connected in parallel to the crystal oscillating unit, a voltage-variable capacitor element connected to the amplifier, comprising:

a frequency drift compensation circuit, outputting a frequency drift compensation control voltage that compensates a frequency drift characteristic according to a power consumption to the voltage-variable capacitor element; and a constant voltage circuit, approximately maintaining a current consumption of the crystal oscillator constant relative to a variation of a power source voltage of the crystal oscillator, wherein the frequency drift compensation circuit outputs the frequency drift compensation control voltage for compensating the frequency drift characteristic according to the power source voltage of the oscillator.

* * * * *